United States Patent
Yamamoto et al.

(10) Patent No.: US 8,612,824 B2
(45) Date of Patent: Dec. 17, 2013

(54) SEMICONDUCTOR MEMORY DEVICE AND CONTROLLING METHOD

(75) Inventors: Kazumasa Yamamoto, Tokyo (JP); Shinichi Kanno, Tokyo (JP); Shigehiro Asano, Kanagawa (JP); Hiroyuki Nagashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 13/038,804

(22) Filed: Mar. 2, 2011

(65) Prior Publication Data

US 2012/0072795 A1 Mar. 22, 2012

(30) Foreign Application Priority Data

Sep. 22, 2010 (JP) ................. 2010-212306

(51) Int. Cl.
*H03M 13/00* (2006.01)
*G11C 29/00* (2006.01)

(52) U.S. Cl.
USPC .......................................... 714/758; 714/763

(58) Field of Classification Search
USPC ................... 714/721, 718, 758, 763
See application file for complete search history.

(56) References Cited

U.S. PATENT DOCUMENTS

| | | | | |
|---|---|---|---|---|
| 6,483,745 B2 * | 11/2002 | Saeki | ....................... | 365/185.04 |
| 7,551,478 B2 | 6/2009 | Kanno | | |
| 7,590,919 B2 | 9/2009 | Kanno | | |
| 7,694,201 B2 * | 4/2010 | Takai | ............................ | 714/734 |
| 7,872,927 B2 * | 1/2011 | Takeda | .................... | 365/189.16 |
| 7,900,117 B2 | 3/2011 | Kanno | | |
| 8,381,085 B2 * | 2/2013 | Kwon et al. | .................. | 714/801 |
| 2002/0024844 A1 * | 2/2002 | Saeki | ....................... | 365/185.22 |
| 2006/0168551 A1 * | 7/2006 | Mukuno | ........................... | 716/5 |
| 2007/0102749 A1 * | 5/2007 | Shirota et al. | ................. | 257/314 |
| 2008/0077349 A1 * | 3/2008 | Takai | ............................. | 702/120 |
| 2008/0165577 A1 * | 7/2008 | Fazan et al. | .................... | 365/174 |
| 2009/0183052 A1 | 7/2009 | Kanno et al. | | |
| 2010/0223531 A1 | 9/2010 | Fukutomi et al. | | |
| 2010/0251075 A1 * | 9/2010 | Takahashi et al. | ............ | 714/773 |
| 2011/0283053 A1 * | 11/2011 | Yamashita | .................... | 711/103 |

FOREIGN PATENT DOCUMENTS

JP 2004-071082 3/2004
JP 2009-176340 8/2009

OTHER PUBLICATIONS

U.S. Appl. No. 12/889,018, filed Sep. 23, 2010, Shinichi Kanno.
U.S. Appl. No. 12/888,822, filed Sep. 23, 2010, Shigehiro Asano, et al.
U.S. Appl. No. 13/035,194, filed Feb. 25, 2011, Fukutomi, et al.
U.S. Appl. No. 13/218,812, filed Aug. 26, 2011, Fukutomi, et al.

* cited by examiner

*Primary Examiner* — Cynthia Britt
(74) *Attorney, Agent, or Firm* — Oblon, Spivak, McClelland, Maier & Neustadt, L.L.P.

(57) ABSTRACT

A semiconductor memory device includes: plural semiconductor memory chips to store information depending on an amount of accumulated charge; plural parameter storage units provided in correspondence with the semiconductor memory chips, each parameter to store therein a parameter that defines an electrical characteristic of a signal used for writing information into or reading information from a corresponding one of the semiconductor memory chips; an error correction encoding unit configured to generate a first correction code capable of correcting an error in the information stored in a number of semiconductor memory chips no greater than a predetermined number out of the semiconductor memory chips, from the information stored in the semiconductor memory chips; and a parameter processing unit configured to change the parameters respectively corresponding to the number of semiconductor memory chips no greater than the predetermined number, and write the parameters changed into the parameter storage units, respectively.

10 Claims, 11 Drawing Sheets

SEMICONDUCTOR MEMORY DEVICE AND CONTROLLING METHOD

CROSS-REFERENCE TO RELATED APPLICATIONS

This application is based upon and claims the benefit of priority from Japanese Patent Application No. 2010-212306, filed on Sep. 22, 2010; the entire contents of which are incorporated herein by reference.

FIELD

Embodiments described herein relate generally to a semiconductor memory device and a semiconductor memory device controlling method.

BACKGROUND

A nonvolatile semiconductor memory device is an information storage device including a memory (nonvolatile semiconductor memory) configured of semiconductor elements that maintain stored information after the power supply is turned off. Some types of nonvolatile semiconductor memories hold information in accordance with the amount of charge that corresponds to the applied voltage or the like. In such nonvolatile semiconductor memories, information is read depending on whether the amount of charge is larger than a threshold value.

Furthermore, in some types of nonvolatile semiconductor memories, parameters that are required when the amount of accumulated charge exceeds the threshold value differ among nonvolatile semiconductor memory chips or among blocks that are units of data erasing in accordance with electrical characteristics of the chips.

In addition, there are some types in which the insulators of memory cells become deteriorated in accordance with the number of times of accumulating charge in the memory cells and the number of times of removing charge from the memory cells and thus parameters required when the voltage exceeds the threshold value become different.

Examples of such nonvolatile semiconductor memory devices include a nonvolatile semiconductor memory using NAND-type flash memories as memory cells.

To cope with differences in necessary threshold voltages for different chips or different blocks of a NAND-type flash memory, a technology has been proposed that the minimum value and distribution of gate voltages corresponding to the applied write pulse voltage are obtained, and write pulse voltages are changed in accordance with the electrical characteristics of the memory cell for each chip or block. In this manner, no excessive stress caused by the electric field between the semiconductor substrate and the floating gate is applied to the tunnel oxide film of the memory cell at the time of erasing data. Furthermore, the data holding reliability of the flash memory is prevented from being degraded, and the data writing speed is also prevented from being lowered because the threshold voltage of the memory cell is brought to a level greater than or equal to the reference threshold voltage by applying a data write pulse voltage.

To cope with the differences in necessary threshold voltages caused by the deteriorated insulators of the memory cells, a technology of checking an appropriate value for a parameter by use of a deterioration monitoring cell to which the same level of stress as the one to the memory cells is applied has been proposed. Test data is written into and read from the deterioration monitoring cell to find a parameter with which information can be accurately read and no excessive stress is applied to the tunnel insulation film, and a pulse is applied to the memory cells by use of this parameter. In this manner, an application voltage can be selected in accordance with the deterioration level of the tunnel insulation film of the memory cells. Hence, the threshold value can be changed in accordance with the deterioration level of the tunnel insulation film caused by the data writing and erasing, the excessive stress placed onto the tunnel insulation film can be alleviated, and the data holding reliability of the flash memory can be prevented from being deteriorated.

With the conventional technology, however, a monitoring cell is required for each chip or block and for each number of writing and erasing operations to change the pulse voltage in accordance with the electrical characteristics of the memory cells for each chip or block and also with the number of information writing and erasing operations. If monitoring cells are prepared for all the chips and blocks and for all the numbers of writing and erasing operations, the number of memory cells that store therein information has to be reduced.

DETAILED DESCRIPTION

According to one embodiment, a semiconductor memory device includes a plurality of semiconductor memory chips configured to store therein information depending on an amount of accumulated charge; a plurality of parameter storage units that are provided in correspondence with the semiconductor memory chips, each of the plurality of parameter storage units being configured to store therein a parameter that defines an electrical characteristic of a signal used for writing information into or reading information from a corresponding one of the semiconductor memory chips; an error correction encoding unit configured to generate a first correction code capable of correcting an error in the information stored in a number of semiconductor memory chips no greater than a predetermined number out of the semiconductor memory chips, from the information stored in the semiconductor memory chips; and a parameter processing unit configured to change the parameters respectively corresponding to the number of semiconductor memory chips no greater than the predetermined number, and writes the parameters changed into the parameter storage units, respectively.

Various embodiments will be described hereinafter with reference to the accompanying drawings.

As described above, the conventional method of using monitor cells raises a problem that the number of memory cells that store therein information (data) is reduced. In addition, to cope with the differences in the necessary threshold voltages among chips or blocks, a value of a pulse voltage suitable for the level of deterioration caused in accordance with the number of writing and erasing operations needs to be found for each chip or block, and the pulse voltage needs to be changed to this value.

Even if the voltage is within a specified range at the time of writing, this voltage may no longer be within the specified range at the time of reading, depending on the deterioration level and electrical characteristics of the cells. For this reason, when the parameter for writing is changed, a value that has been written needs to be read, and whether it is accurately read needs to be examined.

After a parameter is changed, test data is written. During the time of reading the written test data, data cannot be written in or read from the range of the cells for which the parameter is changed, and thus the number of memory cells that are available for the data writing and reading is reduced. The processing speed may decrease if the number of memory cells available for data storage is too small, depending the writing operation algorithm of the nonvolatile semiconductor memory device. Thus, there is a problem that the writing operation speed is lowered during the time of examining whether data can be accurately read after the parameter change.

Figure 1:
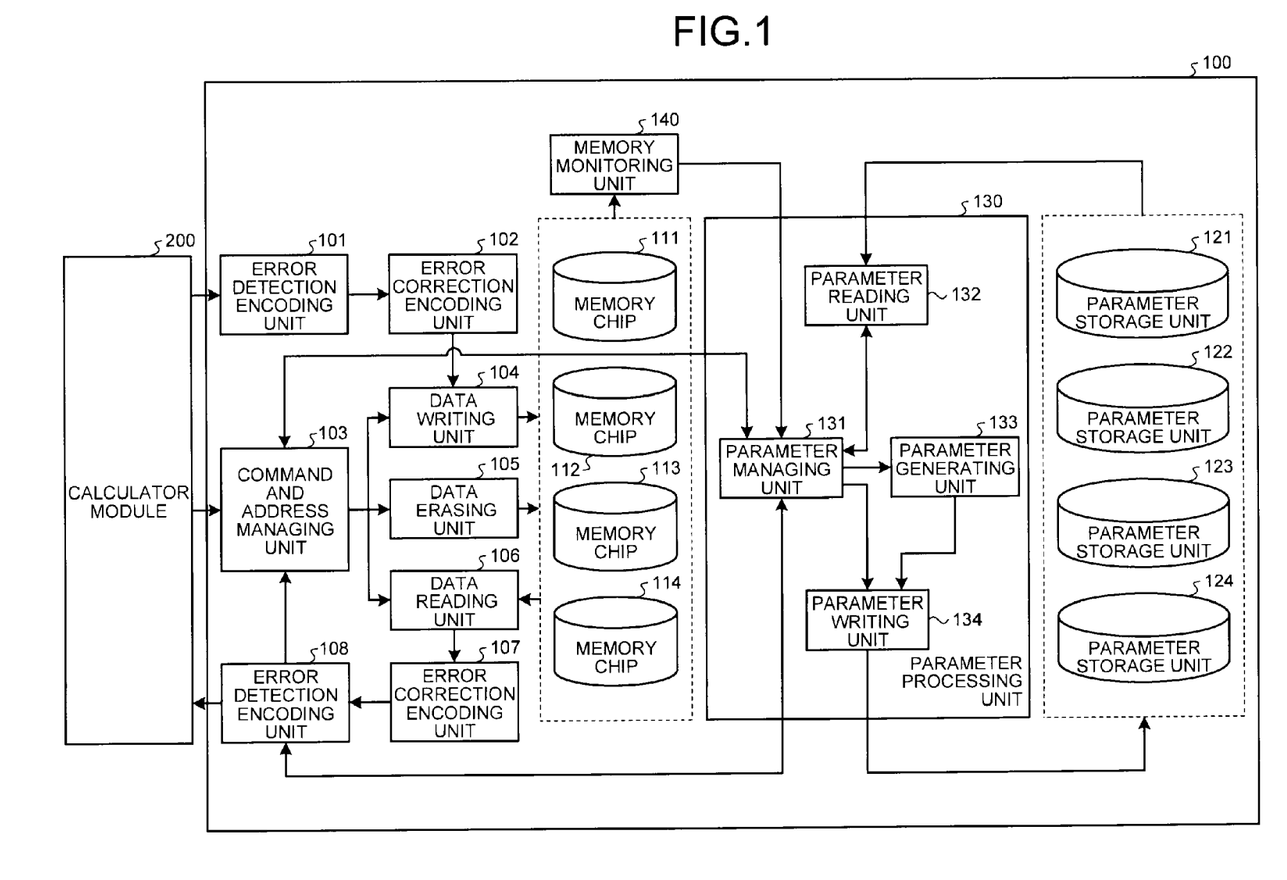
FIG. 1 is a block diagram of a semiconductor memory device according to the embodiment.

FIG. 1 is a block diagram for showing an example of the structure of a semiconductor memory device 100 according to the embodiment. The semiconductor memory device 100 includes a plurality of memory chips 111 to 114 that are semiconductor memory chips, a plurality of parameter storage units 121 to 124, a parameter processing unit 130, a memory monitoring unit 140, an error detection encoding unit 101, an error correction encoding unit 102, a command and address managing unit 103, a data writing unit 104, a data erasing unit 105, a data reading unit 106, an error correction decoding unit 107, and an error detection decoding unit 108.

The memory chips 111 to 114 store therein data corresponding to the amount of charge that is accumulated. The memory chips 111 to 114 are nonvolatile memories in which values to be recorded vary in accordance with parameters. According to the embodiment, one or more nonvolatile memories are collectively referred to as a storage medium. In the example of FIG. 1, four memory chips 111 to 114 are adopted, but the number of memory chips is not limited to four.

The parameter storage units 121 to 124 are provided in correspondence with the memory chips 111 to 114, respectively. Each of the parameter storage units 121 to 124 stores therein parameters that define the electrical characteristics of signals used for writing data into or reading data from the corresponding one of the memory chips.

The following parameters may be adopted for the parameters to be stored:
(1) In Writing (Prog)
  start Vpgm: applied voltage at the first time
  $\Delta$Vpgm: voltage applied at the second and subsequent times
  pulse width: pulse width of applied voltage
  verify level: threshold value of applied voltage
  not-selected word line (WL) voltage: voltage applied to word line that is not selected in writing (2) In Reading (Read)
  Icell: current flowing to gate electrode
  VREAD: voltage applied to gate electrode
  sense time: time required at sense amplifier (amount of voltage amplification at sense amplifier)
  cell coupling: voltage added to adjacent cells in reading
  read level: threshold value to determine 0 or 1 from the amount of current flowing from drain electrode
(3) In Erasing (Erase)
  depth of erase: threshold value of charge determined as data erasure
  erase VERA voltage pulse width: pulse width of erase voltage VERA Each of the parameter storage units 121 to 124 further stores therein information (flag) that indicates that a parameter is being changed or has been established, in association with each parameter. Each of the parameter storage units 121 to 124 also stores therein parameters in such a manner as to identify parameters corresponding to addresses transmitted from the command and address managing unit 103. The storing method may be any method as long as the parameters can be identified from the addresses. For example, information indicating the association between the addresses and the parameters may be stored.

The memory monitoring unit 140 generates management data that indicates the state of data writing and reading with respect to the memory chips 111 to 114 and stores it therein. When a value of the management data exceeds a predetermined threshold, the memory monitoring unit 140 notifies a parameter managing unit 131 (described later) in the parameter processing unit 130 of a type of management data having the value that exceeds the threshold, the exceeded value of the management data, and information that identifies a memory chip corresponding to the management data having the exceeded value (identification information). As the management data, the number of writing operations in each memory chip, the number of erasing operations in each memory chip, the writing time for each memory chip, and the reading time for each memory chip may be monitored. This is because the NAND-type flash memory tends to become deteriorated in the erasing operation, and it tends to be easier to write into and more difficult to read from as the deterioration proceeds.

The parameter processing unit 130 changes parameters that are stored in a certain number of parameter storage units 121 to 124 no larger than the number of error-correctable memory chips predetermined by the error correction encoding unit 102, and stores the changed parameters in the parameter storage units 121 to 124. The parameter processing unit 130 executes the operation of changing parameters (parameter changing operation) when the management data monitored by the memory monitoring unit 140 satisfies the predetermined condition. For example, the parameter changing operation is executed when the value of the management data exceeds the threshold value, as described above.

The parameter processing unit 130 includes a parameter managing unit 131, a parameter reading unit 132, a parameter generating unit 133, and a parameter writing unit 134.

The parameter managing unit 131 manages the parameter operation. For example, the parameter managing unit 131 receives a command and an address from the command and address managing unit 103 (described later), and issues a command of reading a parameter that corresponds to the command and the address to the parameter reading unit 132. Then, the parameter managing unit 131 sends the parameter received from the parameter reading unit 132 to the command and address managing unit 103.

In addition, when receiving from the memory monitoring unit 140 the type of management data having the value that exceeds the threshold, the exceeded value of the management data, and the identification information of the memory chip corresponding to the management data having the exceeded value, the parameter managing unit 131 sends the information received from the memory monitoring unit 140 to the parameter generating unit 133.

When an error is detected in the data for which the parameters are being changed, the parameter managing unit 131 receives the detection result and the address from the error detection decoding unit 108, and transmits the information received from the error detection decoding unit 108 to the parameter generating unit 133.

In addition, when receiving from the error detection decoding unit 108 the completion of changing the parameters as well as the address, the parameter managing unit 131 sends information indicating that the parameter has been determined as well as the address to the parameter writing unit 134.

The parameter reading unit 132 receives the address from the parameter managing unit 131, and reads the parameter corresponding to the received address from the parameter storage units 121 to 124. The parameter reading unit 132 sends the parameter read from the parameter storage units 121 to 124 to the parameter managing unit 131.

The parameter generating unit 133 generates, for each of the memory chips 111 to 114, a parameter that is to be provided for each of the memory chips 111 to 114. The generation of the parameters may be conducted with any method. For example, when there is a high probability, based on the result of the error correction, that a low charge state is mistaken for a high charge state, the parameter generating unit 133 increases the value of the parameter. Alternatively, the parameter generating unit 133 may determine the change amount of the parameter in accordance with the frequency of errors.

The parameter generating unit 133 sends the parameter generated for each of the memory chips 111 to 114 and the address to the parameter writing unit 134. At this time, the parameter generating unit 133 adds to the parameter the information indicating that the parameter is in the process of being changed.

The parameter writing unit 134 receives the parameter, the address, and the information indicating that the parameter is being changed from the parameter generating unit 133. The parameter writing unit 134 identifies one of the parameter storage units 121 to 124 in which the parameter to be changed to is stored by use of the received address, and stores the changed parameter in the identified one of the parameter storage units 121 to 124. When receiving the information indicating that the parameter is being changed, the parameter writing unit 134 adds to the parameter the information (flag) indicating that the parameter is being changed, and stores it in the corresponding one of the parameter storage units 121 to 124.

When receiving the information indicating that the parameter has been determined and the address from the parameter managing unit 131, the parameter writing unit 134 identifies the parameter corresponding to the received address, and adds to the identified parameter the information that the parameter has been determined.

The command and address managing unit 103 receives commands and addresses from a calculator module 200, and divides the operations in accordance with the commands. The calculator module 200 is a device that makes an access to the data stored in the semiconductor memory device 100, and may be a personal computer, for example. Examples of commands include a write command, an erase command, a read command, and a rewrite command.

The error detection encoding unit 101 receives data from the calculator module 200, and performs an error detection code encoding process onto the received data. The error detection encoding unit 101 sends the data subjected to the encoding process to the error correction encoding unit 102.

The error correction encoding unit 102 receives the data from the error detection encoding unit 101, and performs an error correction encoding process onto the received data. The error correction encoding unit 102 sends the data subjected to the encoding process to the data writing unit 104.

Figure 2:
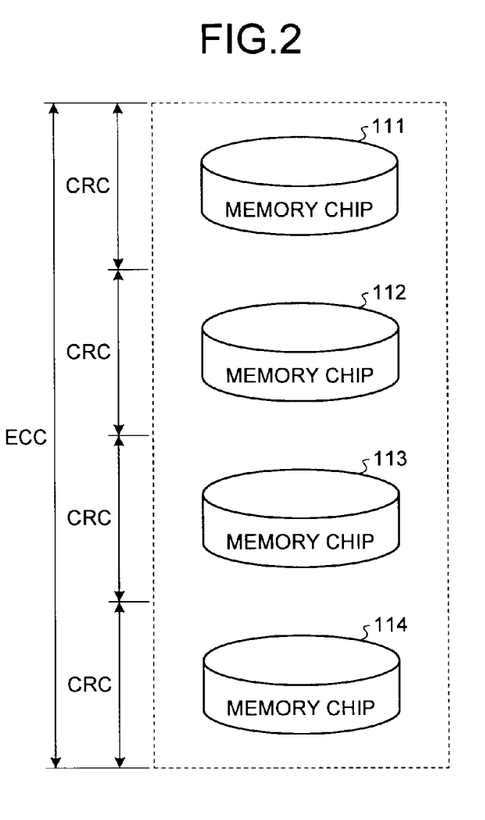
FIG. 2 is a diagram for showing an error detection range and an error correction range.

The error correction encoding unit 102 generates an error correction code (first correction code) that can correct an error in the data stored in the number of memory chips no larger than the predetermined number, from the data stored individually in the memory chips 111 to 114. FIG. 2 is a diagram for showing the error detection range and the error correction range. According to the embodiment, an error detection code (CRC) is generated for each of the memory chips 111 to 114, and an error correction code (ECC) is generated from the data written in the plurality of memory chips 111 to 114. For this reason, the data needs to be read from the plurality of memory chips 111 to 114 for the error correction decoding operation.

Figure 3:
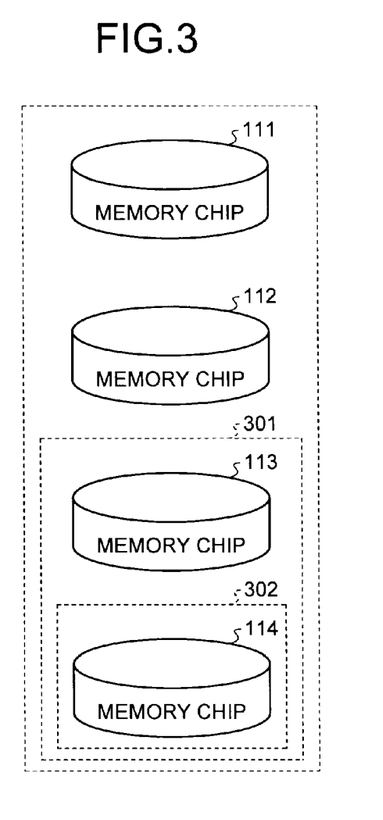
FIG. 3 is a diagram for showing the error correction range.

FIG. 3 is a diagram for showing the error correction range. The range 301 indicates an example of an error correctable range, and the range 302 indicates an example of the parameter changing range. In other words, the example of FIG. 3 indicates that errors in the data of the predetermined number=2 out of the four memory chips 111 to 114 are correctable. The predetermined number (the number of memory chips in which errors are correctable) is not limited to 2, but can be arbitrarily established.

Returning to the description of FIG. 1, the command and address managing unit 103 sends the received address and command to the parameter managing unit 131, and receives the parameter transmitted by the parameter managing unit 131. Then, the command and address managing unit 103 sends the parameter and the address to the data writing unit 104, the data erasing unit 105, and the data reading unit 106 that execute the operations corresponding to the received commands. Only when the command and address managing unit 103 receives a rewrite command, the command and address managing unit 103 sends the parameter, the address, and the data to the data writing unit 104.

The data writing unit 104 receives the parameter and the address from the command and address managing unit 103, and also receives data subjected to the error correction code encoding process, from the error correction encoding unit 102. The data writing unit 104 writes the received data into a memory cell in one of the memory chips 111 to 114 corresponding to the address, in accordance with the received parameter.

The data erasing unit 105 receives the parameter and the address from the command and address managing unit 103. The data erasing unit 105 erases the data from the memory cell in one of the memory chips 111 to 114 corresponding to the received address, in accordance with the received parameter.

The data reading unit 106 receives the parameter and the address from the command and address managing unit 103, and reads the data corresponding to the received address from the memory cell in the corresponding one of the memory chips 111 to 114 in accordance with the received parameter. The data reading unit 106 sends the read-in data, the parameter, and the address to the error correction decoding unit 107.

The error correction decoding unit 107 receives the data, the address, and the parameter from the data reading unit 106, and decodes the received data with the error correction code. In this manner, error detection and error correction of the received data can be performed.

When no error is detected, the error correction decoding unit 107 outputs the data, and when any error is detected, it executes error correction. Here, the error correction decoding unit 107 corrects the error if the error is within the error correctable range, adds to the parameter the information indicating that the error has been corrected, and outputs the data, the address, and the parameter to the error detection decoding unit 108. If the error cannot be corrected because it is not in the error correctable range, the error correction decoding unit 107 outputs the error data, the address, and the parameter to the error detection decoding unit 108.

The error detection decoding unit 108 receives the data (including the error data), the address, and the parameter from the error correction decoding unit 107, and performs the error detection code decoding process onto the received data. As illustrated in FIG. 2, the error detection decoding unit 108 performs the error detection code decoding process onto each of the memory chips 111 to 114, and detects errors in the data.

If no error is detected, the error detection decoding unit 108 sends the data to the calculator module 200. If any error is detected, the error detection decoding unit 108 notifies the calculator module 200 of data defects.

When the data sent from the error correction decoding unit 107 is the data for which the parameter is being changed, when error correction is not executed by the error correction decoding unit 107, and also when no error is detected by the error detection decoding unit 108, the error detection decoding unit 108 notifies the parameter managing unit 131 that the parameter has been determined.

When the data sent from the error correction decoding unit 107 is the data for which the parameter is being changed, when error correction is executed by the error correction decoding unit 107, when data errors within the error correctable range are corrected, and also when no error is detected by the error detection decoding unit 108, the error detection decoding unit 108 notifies the parameter managing unit 131 of the resetting of the parameter. In such a situation, the error detection decoding unit 108 sends the address and the data to the command and address managing unit 103, and sends the data to the calculator module 200.

The error detection decoding unit 108 may determine whether the parameter of the received data is in the process of being changed or the determined parameter, based on the information attached to the data or the parameter, or on the information sent from the parameter generating unit 133 at the time of generating the parameter.

Figure 4:
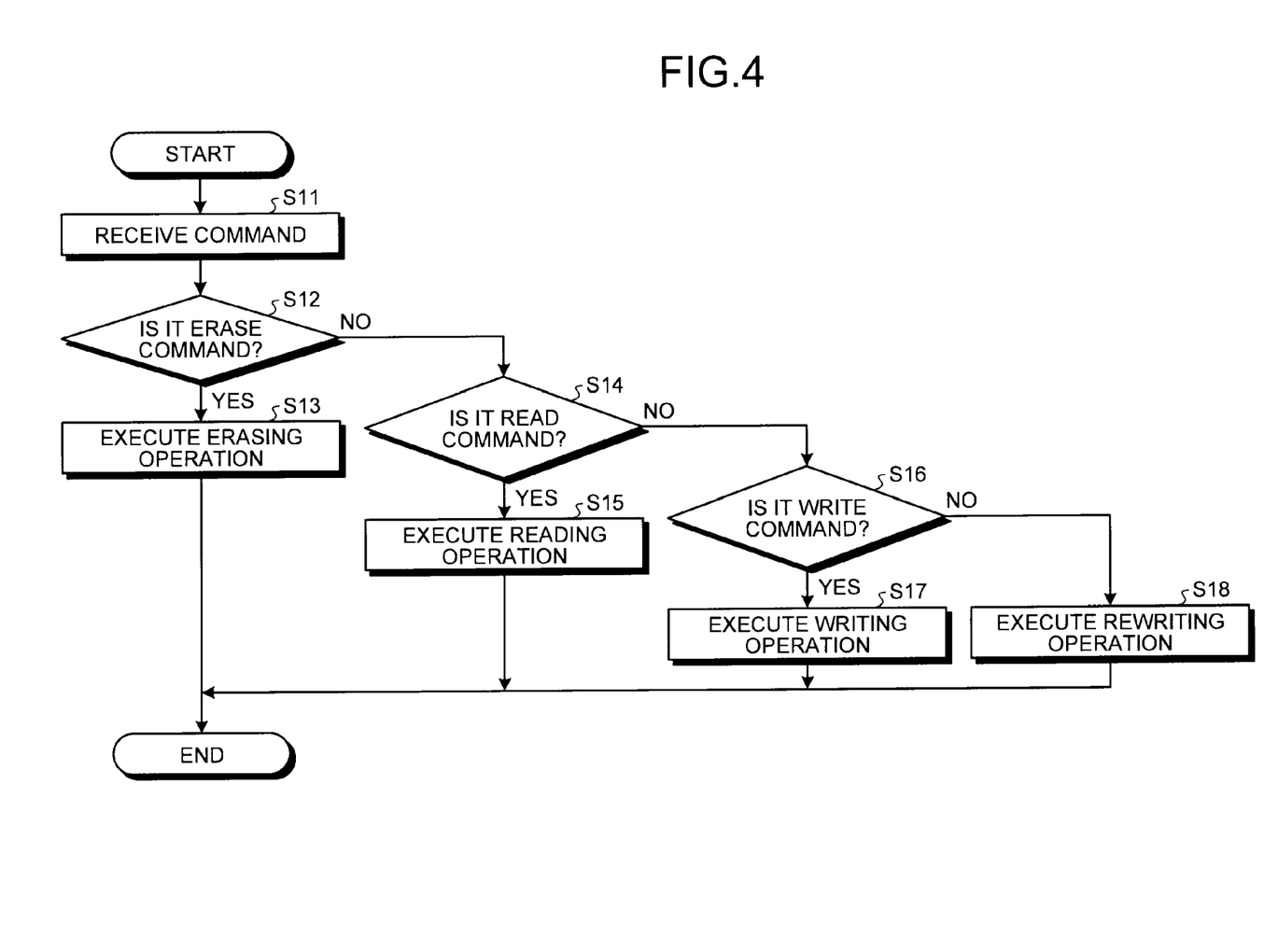
FIG. 4 is a flowchart of a command receiving operation.

Next, the operations executed by the semiconductor memory device 100 configured as above according to the embodiment are explained below. FIG. 4 is a flowchart of the entire command receiving operation according to the embodiment.

First, the command and address managing unit 103 receives the address and the command from the calculator module 200 (Step S11). Hereinafter, the command and address managing unit 103 determines the type of the received command, and issues an request to the corresponding processing unit (the data writing unit 104, the data erasing unit 105, or the data reading unit 106) so that an operation is executed in accordance with the type (Steps S12 to S18). The command and address managing unit 103 asks for and obtains the parameter corresponding to the received address from the parameter managing unit 131, and sends the obtained parameter and the command to the corresponding processing unit.

The command and address managing unit 103 determines whether the command is an erase command (Step S12). If it is an erase command (Yes at Step S12), the command and address managing unit 103 sends the parameter and the address to the data erasing unit 105, and issues a request for the data erasing operation. When receiving this request, the data erasing unit 105 executes the erasing operation (Step S13). The erasing operation will be described in detail later.

When the command is not an erase command (No at Step S12), the command and address managing unit 103 determines whether it is a read command (Step S14). When it is a read command (Yes at Step S14), the command and address managing unit 103 sends the parameter and the address to the data reading unit 106, and issues a request for the data reading operation. When receiving this request, the data reading unit 106 executes the reading operation (Step S15). The reading operation will be described in detail later.

When the command is not a read command (No at Step S14), the command and address managing unit 103 determines whether the command is a write command (Step S16). When it is a write command (Yes at Step S16), the command and address managing unit 103 sends the parameter and the address to the data writing unit 104, and issues a request for the data writing operation. When receiving this request, the data writing unit 104 executes the writing operation (Step S17). The writing operation will be described in detail later.

When the command is not a write command (No at Step S16), the command and address managing unit 103 determines that the command is a rewrite command, sends the parameter, the address, and the data to the data writing unit 104 and issues a request for the data rewriting operation. When receiving this request, the data writing unit 104 executes the rewriting operation (Step S18). The rewire operation will be described later.

Figure 5:
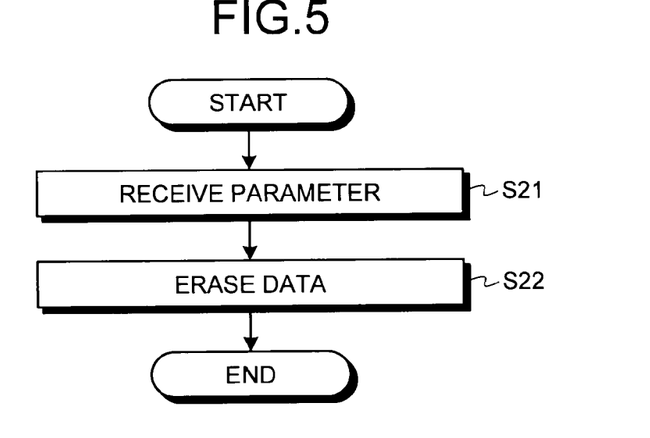
FIG. 5 is a flowchart of an erasing operation.

Next, the erasing operation of Step S13 is explained in detail. FIG. 5 is a flowchart of the entire erasing operation according to the embodiment.

First, the data erasing unit 105 receives the parameter and the address from the command and address managing unit 103 (Step S21). Next, the data erasing unit 105 erases the data of the memory cell in one of the memory chips 111 to 114 that corresponds to the received address, in accordance with the received parameter (Step S22).

Figure 6:
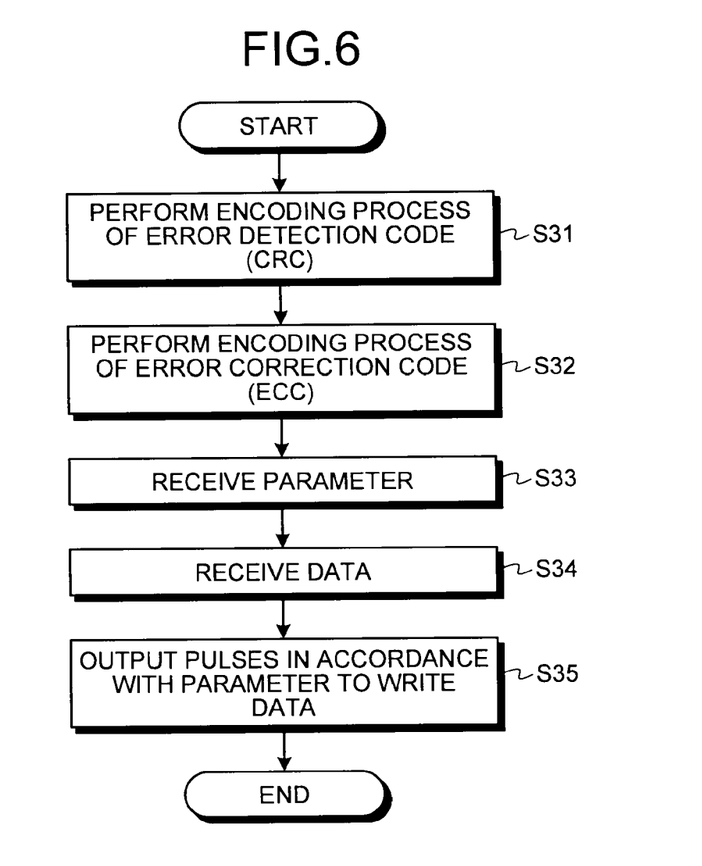
FIG. 6 is a flowchart of a writing operation.

Next, the writing operation of Step S17 is explained in detail. FIG. 6 is a flowchart of the entire writing operation according to the embodiment.

First, the error detection encoding unit 101 performs the error detection code encoding process onto the data received from the calculator module 200 (Step S31). The error detection encoding unit 101 sends the data subjected to the encoding process to the error correction encoding unit 102.

The error correction encoding unit 102 performs the error correction code encoding process onto the data received from the error detection encoding unit 101 (Step S32). The error correction encoding unit 102 sends the data subjected to the encoding process to the data writing unit 104.

The data writing unit 104 receives the parameter and the address from the command and address managing unit 103 (Step S33). In addition, the data writing unit 104 receives the data subjected to the encoding process by the error correction encoding unit 102 (Step S34).

The data writing unit 104 writes the received data into a memory cell in one of the memory chips 111 to 114 corresponding to the received address, in accordance with the received parameter (Step S35).

Figure 7:
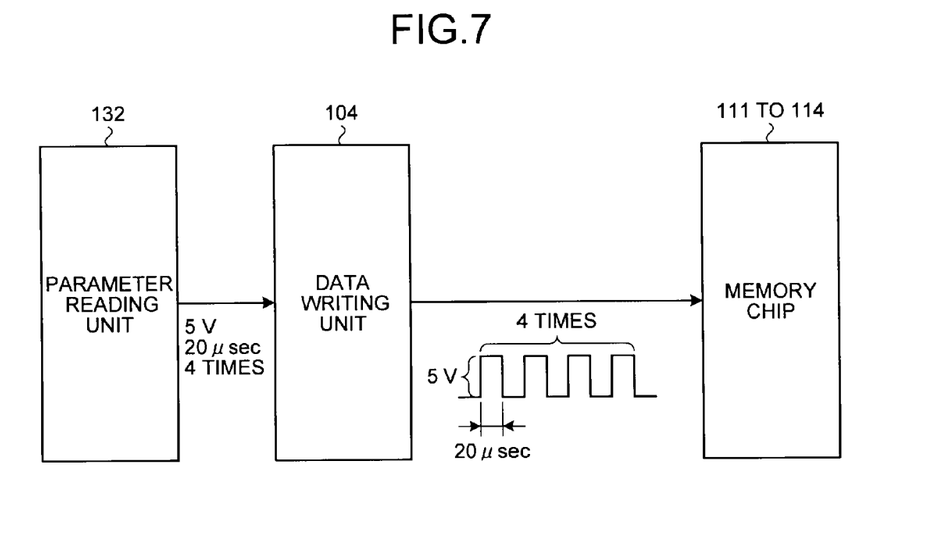
FIG. 7 is a diagram for showing a specific example of the writing operation.

FIG. 7 is a diagram for showing an example of the writing operation performed by the data writing unit 104. In the example of FIG. 7, the parameter reading unit 132 first obtains, from one of the parameter storage units 121 to 124 corresponding to the address, parameters indicating that the pulse voltage is 5 V, the pulse width is 20 µs, and the pulse number is four. The data writing unit 104 writes data into the memory chips 111 to 114 in accordance with these parameters.

Figure 8:
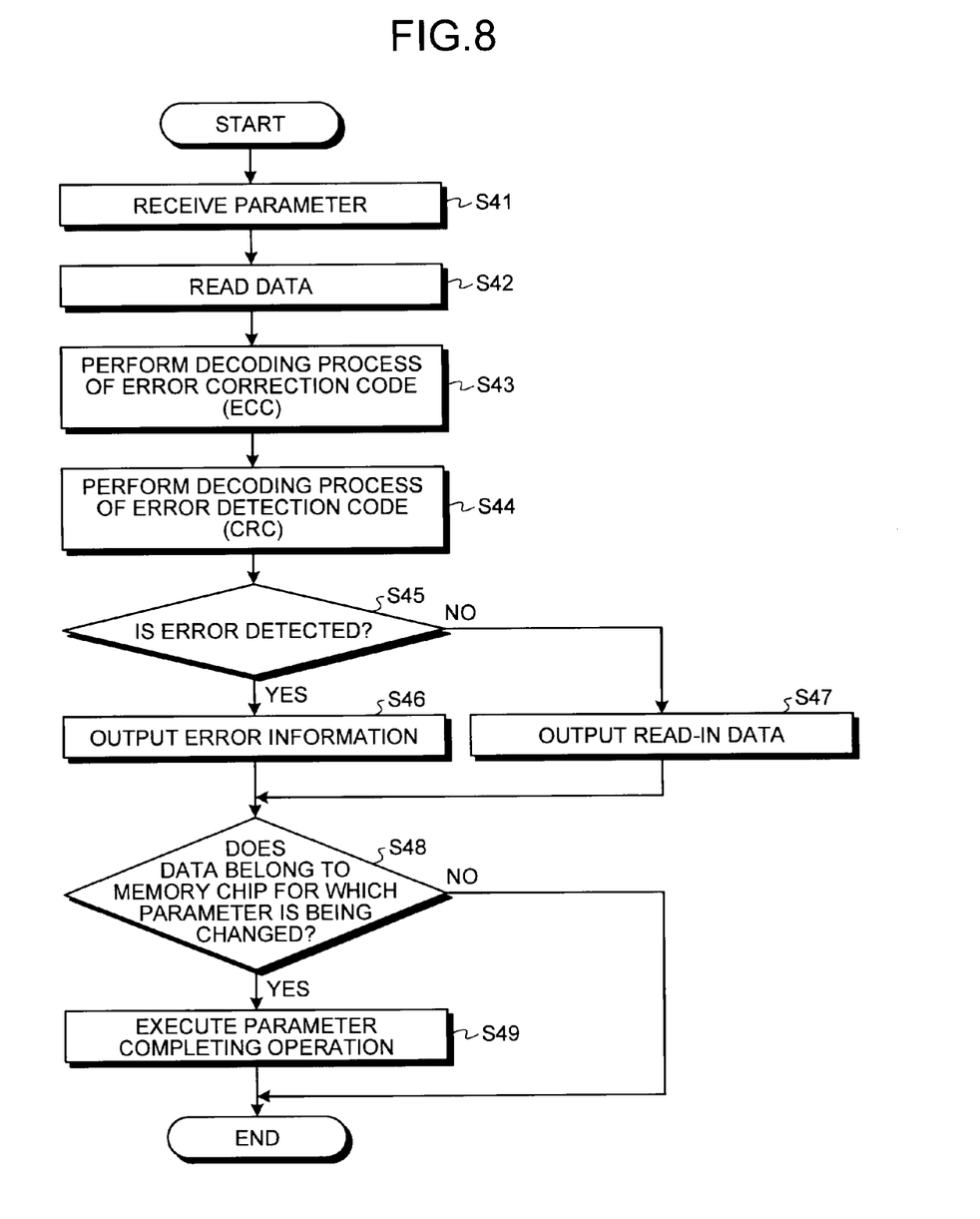
FIG. 8 is a flowchart of a reading operation.

Next, the reading operation of Step S15 is explained in detail. FIG. 8 is a flowchart of the entire reading operation according to the embodiment.

First, the data reading unit 106 receives the parameter and the address from the command and address managing unit 103 (Step S41). The data reading unit 106 reads the data corresponding to the received address from the memory cell in the corresponding one of the memory chips 111 to 114 in accordance with the received parameter (Step S42). The data reading unit 106 sends the read-in data, the parameter, and the address to the error correction decoding unit 107.

The error correction decoding unit 107 performs the error correction code (ECC) decoding process onto the data received from the data reading unit 106 (Step S43).

Next, the error detection decoding unit 108 performs the error detection code (CRC) decoding process onto the data received from the error correction decoding unit 107 (Step S44). The error detection decoding unit 108 determines whether any error is detected (Step S45). When an error is detected (Yes at Step S45), the error detection decoding unit 108 outputs information on occurrence of an error (data defect) to the calculator module 200 (Step S46). When no error is detected (No at Step S45), the error detection decoding unit 108 outputs the read-in data to the calculator module 200 (Step S47).

The error detection decoding unit 108 determines whether the data received from the error correction decoding unit 107 is the data of the memory chips 111 to 114 for which the parameter is being changed (Step S48). When it is the data of the memory chips 111 to 114 for which the parameter is being change (Yes at Step S48), the parameter completing operation is executed (Step S49). The parameter completing operation will be explained in detail later.

After the parameter completing operation, or when it is determined at Step S48 that the data is not the data of the memory chips 111 to 114 for which the parameter is being changed (No at Step S48), the reading operation is terminated.

Figure 9:
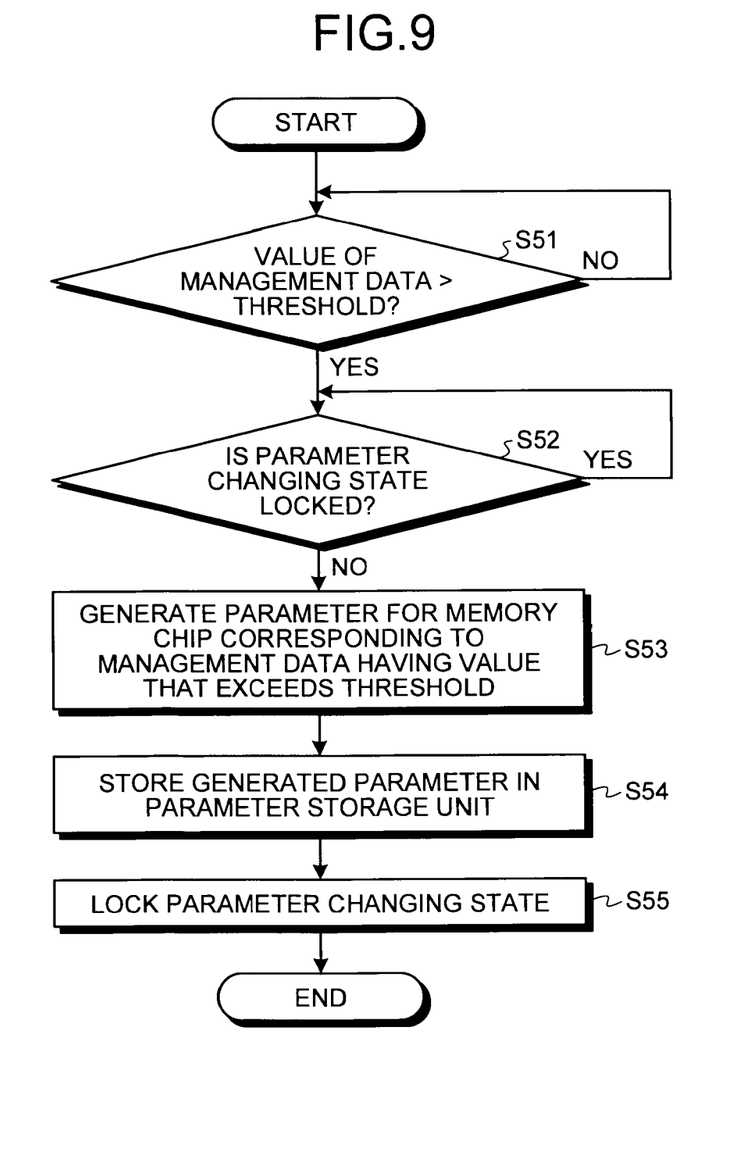
FIG. 9 is a flowchart of a parameter changing operation.

Next, the parameter changing operation is explained. FIG. 9 is a flowchart of the entire parameter changing operation according to the embodiment.

First, the memory monitoring unit 140 determines whether a value of the management data exceeds the predetermined threshold value (Step S51). When the value of the management data does not exceed the predetermined threshold value (No at Step S51), monitoring is continued until it exceeds.

When a value of the management data exceeds the threshold value (Yes at Step S51), the parameter managing unit 131 determines whether the parameter changing state is stopped (locked) (Step S52). For example, the information indicating the locked state is stored in a not-shown storage unit or the like when the parameter changing state is locked (Step S55, described later), and the parameter managing unit 131 determines, by referring to this information, whether the state is locked.

When the state is locked (Yes at Step S52), the parameter managing unit 131 holds the operation until the locked state is released. When it is not locked (No at Step S52), the memory monitoring unit 140 notifies the parameter managing unit 131 of the type of management data having the data that exceeds the threshold, the exceeded value of the management data, and the identification information of the memory chip corresponding to the management data having the exceeded value. The parameter managing unit 131 sends the data notified of by the memory monitoring unit 140 to the parameter generating unit 133.

The parameter generating unit 133 generates a parameter of the memory chip corresponding to the management data having the value that exceeds the threshold (Step S53), and sends it to the parameter writing unit 134. The parameter writing unit 134 stores the parameter received from the parameter generating unit 133 in the parameter storage units 121 to 124 (Step S54).

Here, the parameter managing unit 131 compares the number of memory chips for which the parameters have been changed with the predetermined number, and stops (locks) the parameter changing state if the number of memory chips reaches the predetermined number (Step S55). In this manner, according to the embodiment, parameters are changed within an error correctable range. Thus, even when the data cannot be accurately written or read due to a changed parameter, the error correction decoding unit 107 has a function of returning it to correct data.

Figure 10:
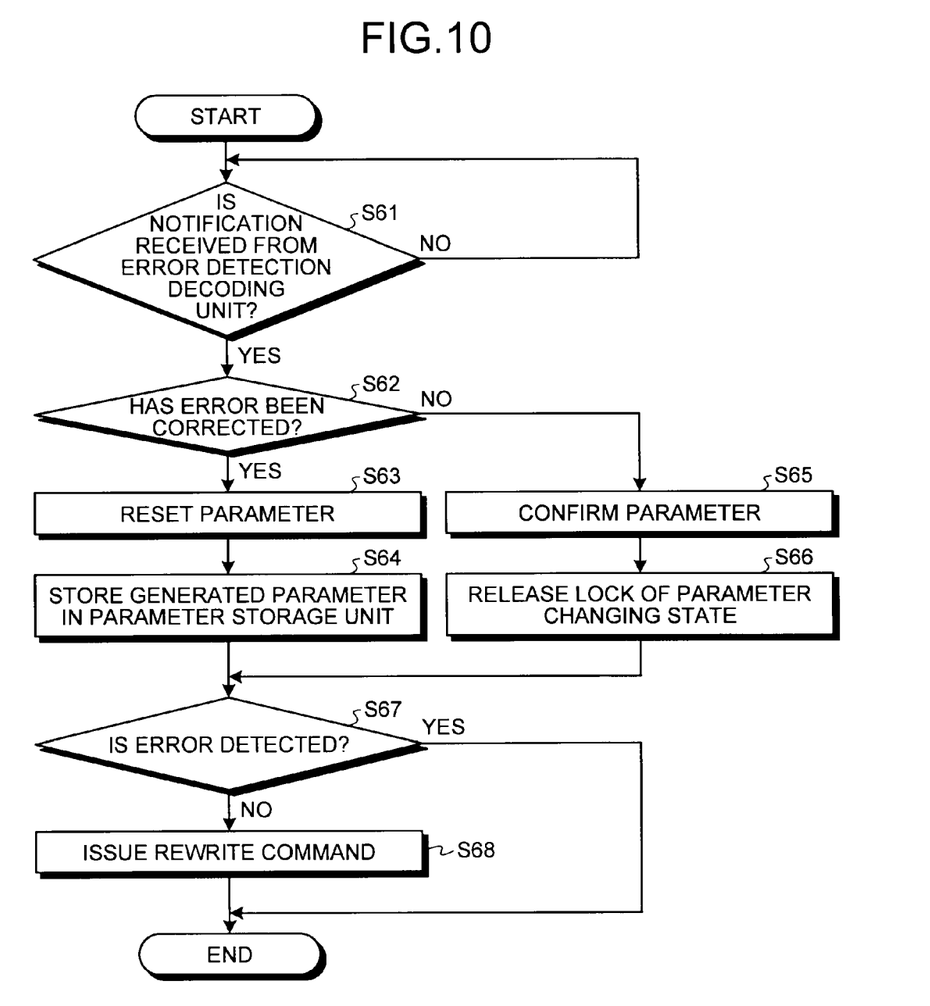
FIG. 10 is a flowchart of a parameter completing operation.

Next, the parameter completing operation of Step S49 is explained in detail. FIG. 10 is a flowchart of the entire parameter completing operation according to the embodiment.

The parameter managing unit 131 determines whether a notification of the parameter resetting or a notification of the completion of the parameter change is received from the error detection decoding unit 108 (Step S61). When no notification is received (No at Step S61), the operation is repeated until a notification is received.

When a notification is received (Yes at Step S61), the parameter managing unit 131 determines whether the notification is of the parameter resetting, or in other words, whether an error in the data of the memory chips 111 to 114 for which the parameter is being changed has been corrected (Step S62). When the parameter resetting is notified of (Yes at Step S62), the parameter managing unit 131 issues a request for resetting the parameter to the parameter generating unit 133.

The parameter generating unit 133 re-changes the requested parameter, and sends it to the parameter writing unit 134 (Step S63). The parameter writing unit 134 stores the parameter transmitted from the parameter generating unit 133 in one of the parameter storage units 121 to 124 (Step S64).

As discussed above, the parameter generating unit 133 determines the parameter to be reset in accordance with the result of the error correction. Moreover, the parameter generating unit 133 may reset a parameter so that it is returned to the parameter before the change. In such a case, for example, the parameter before the change should be stored in the storage unit or the like (not shown) at the time of parameter change so that the stored parameter can be referred to at the time of resetting.

When a notification of parameter resetting is not received at Step S62, or in other words, when a notification of the completion of parameter change is received (No at Step S62), the parameter managing unit 131 sends information indicating that the parameter has been determined and the address to the parameter writing unit 134.

The parameter writing unit 134 identifies the parameter corresponding to the received address, and adds the information indicating that the identified parameter is the determined parameter so as to establish the parameter (Step S65). For example, the parameter writing unit 134 brings a flag indicating that the parameter has been established into correspondence with the parameter, and stores it in one of the parameter storage units 121 to 124.

The parameter managing unit 131 releases the locked state of the parameter change (Step S66). For example, the parameter managing unit 131 stores the information indicating that the parameter changing state is locked in the not-shown storage unit or the like when it is locked, and releases the locked state by either deleting this information or updating it to information indicating that the locked state is released.

After Step S64 or S66, the parameter managing unit 131 determines whether an error is detected, based on whether the detection result indicating that an error is detected is received from the error detection decoding unit 108 (Step S67). When an error is detected (Yes at Step S67), the parameter completing operation is terminated.

When no error is detected (No at Step S67), the parameter managing unit 131 issues a rewrite command to rewrite data in accordance with the reset parameter, and notifies the command and address managing unit 103 of the rewrite command, the address, and the data (Step S68).

Figure 11:
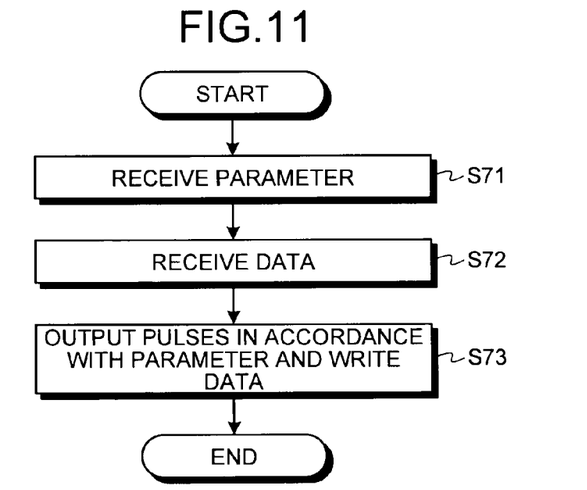
FIG. 11 is a flowchart of a rewriting operation.

FIG. 11 is a flowchart of the entire rewriting operation according to the embodiment. As explained with reference to FIG. 4, the rewriting operation is executed by the data writing unit 104 when the command and address managing unit 103 receives a rewrite command (Step S18).

First, the data writing unit 104 receives the parameter, the address, and the data from the command and address managing unit 103 (Steps S71 and S72). The data writing unit 104 writes the received data into the memory cell in one of the memory chips 111 to 114 corresponding to the address in accordance with the received parameter (Step S73). Because the error detection code encoding process and the error correction code encoding process are already executed at the previous writing, each encoding process does not have to be executed in the rewriting operation.

First Modification Example

If a parameter for writing data into one memory chip is changed but the data cannot be accurately read in accordance with the changed parameter, the data needs to be corrected to accurate data in the error correcting process, and this data needs to be newly written. In this process, the parameter does not have to be written into the memory chip for which the parameter has been changed, but may be written into a different memory chip. With such a structure, the writing operation can be executed in parallel with the parameter changing operation.

Figure 12:
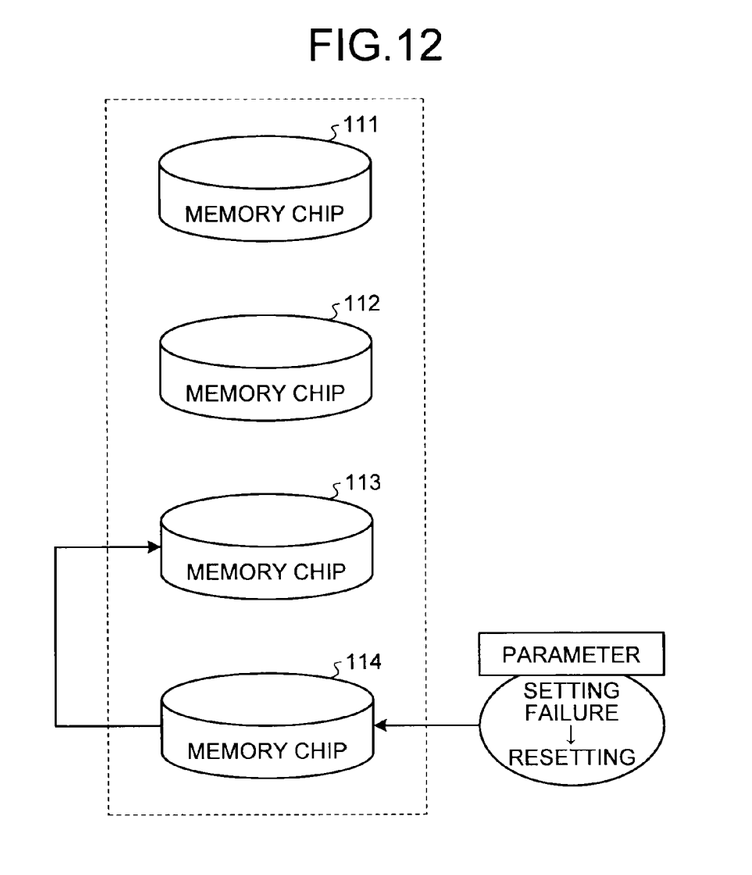
FIG. 12 is a diagram for showing a process of the first modification example.

FIG. 12 is a diagram for showing an example of the operation of writing the data onto a different memory chip. In the example of FIG. 12, the parameter for the memory chip 114 has been changed, but if the parameter needs to be reset because the data cannot be accurately read, the data is written into the memory chip 113.

In a NAND-type flash memory, the number of rewriting operations is limited for each memory cell. Thus, wear leveling of distributing the rewriting operation over different memory cells to avoid the concentration of rewriting into a specific memory cell has been known as a technology for extending the usage life. With the method similar to this technology, in the first modification example, a memory chip into which the corrected data is written is designated as a memory chip different from the original memory chip.

Figure 13:
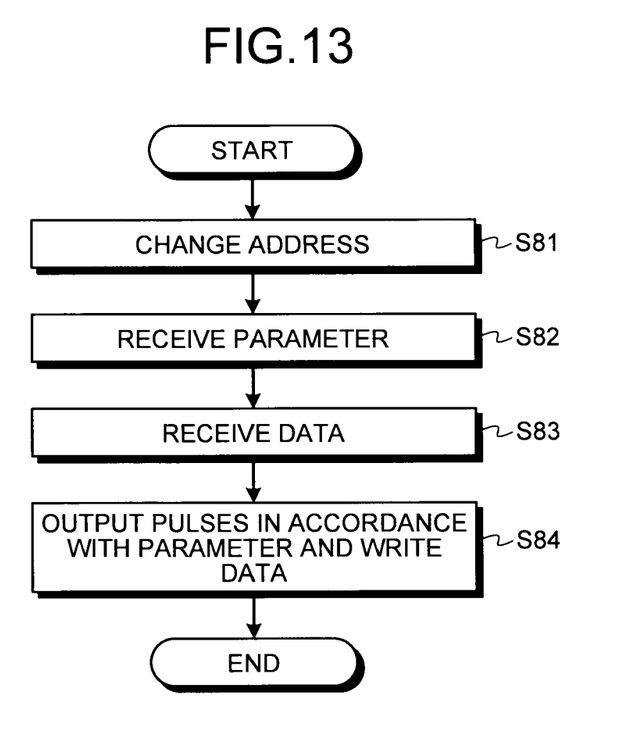
FIG. 13 is a diagram for showing a flowchart of the rewriting operation of the first modification example.

FIG. 13 is a flowchart of the entire rewriting operation in the first modification example.

In the first modification example, the command and address managing unit 103 changes a write destination address at which data is to be written to the address of a memory chip different from the address of the memory chip in which the data has been stored (Step S81). Steps S82 to S84 are the same as Steps S71 to S73 of FIG. 11, and thus the explanation thereof is omitted.

Second Modification Example

In the error correction code encoding process, the process is executed onto the data that is to be written into the plurality of memory chips 111 to 114. For this reason, when the error correction code decoding process is executed, the data needs to be read also from the plurality of memory chips 111 to 114.

Figure 14:
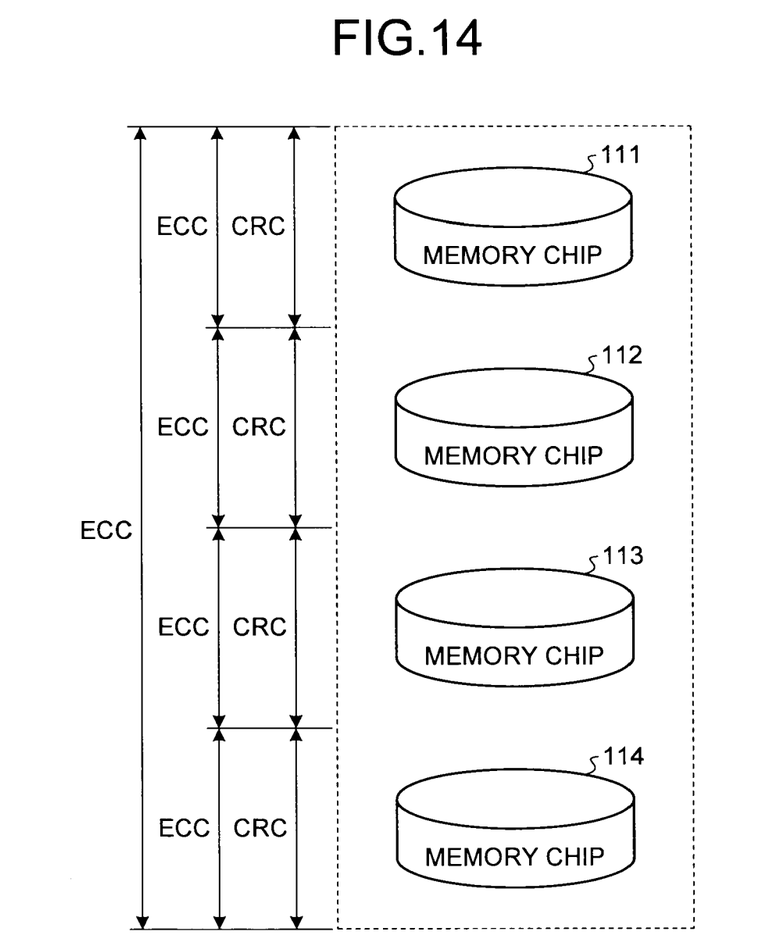
FIG. 14 is a diagram for showing an error detection range and an error correction range in the second modification example.

Therefore, the structure may be such that, separately from the error correcting process performed onto the data in the memory chips 111 to 114, the error correcting process is performed for each chip. FIG. 14 is a diagram for showing the error detection range and the error correction range of such a structure in the second modification example. As shown in FIG. 14, in this modification example, error correction codes (ECC) are generated not only from the data written into the memory chips 111 to 114, but generated also for each of the memory chips 111 to 114. With such a structure, the error correction decoding process can be performed on the data stored in each of the memory chips 111 to 114.

As discussed above, the semiconductor memory device according to the embodiment changes parameters for writing in and reading from memory chips within an error correctable range. Hence, even when the parameters are not accurately set and data cannot be accurately read, the data can be decoded into correct data in the error correction. Even if the parameters are not accurately set, correct data can be reconstructed afterwards, which means that the accuracy of the parameter setting can be judged not at the time of setting but at the time of reading the data. For this reason, the wait time for the data writing operation and the data reading operation to determine whether parameters are accurately set is not required at the time of setting the parameters. Hence, the operation speed is prevented from being reduced, without damaging the data reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of semiconductor memory chips configured to store therein information depending on an amount of accumulated charge;
a plurality of parameter storage units that are provided in correspondence with the semiconductor memory chips, each of the plurality of parameter storage units being configured to store therein a parameter that defines an electrical characteristic of a signal used for writing information into or reading information from a corresponding one of the semiconductor memory chips;
an error correction encoding unit configured to generate a first correction code capable of correcting an error in the information stored in a number of semiconductor memory chips no greater than a predetermined number out of the semiconductor memory chips, from the information stored in the semiconductor memory chips; and a parameter processing unit configured to change the parameters respectively corresponding to the number of semiconductor memory chips no greater than the predetermined number, and writes the parameters changed into the parameter storage units, respectively.

2. The semiconductor memory device according to claim 1, further comprising an error correction decoding unit configured to correct the error in the information by performing a decoding process of the first correction code, wherein when the error in the information stored in the semiconductor memory chips for which the parameters have been changed is corrected, the parameter processing unit re-changes the parameters changed and writes the parameters re-changed into the parameter storage units, respectively.

3. The semiconductor memory device according to claim 2, wherein, when the error in the information stored in the semiconductor memory chips for which the parameters have been changed is corrected, the parameter processing unit restores the parameters changed to the parameters before change, and writes the parameters restored into the parameter storage units, respectively.

4. The semiconductor memory device according to claim 2, wherein, when the error in the information stored in the semiconductor memory chips for which the parameters have been changed is corrected, the parameter processing unit changes the parameters changed to parameters that is determined in accordance with a correction result, and writes the parameters determined into the parameter storage units, respectively.

5. The semiconductor memory device according to claim 1, further comprising a data writing unit configured to, when the error in the information stored in the semiconductor memory chips for which the parameters have been changed is corrected, write the information corrected into a semiconductor memory chip different from the semiconductor memory chips for which the parameters have been changed.

6. The semiconductor memory device according to claim 1, wherein the error correction encoding unit further generates, for each of the semiconductor memory chips, a second correction code capable of correcting a plurality of errors in the information from a plurality of pieces of the information stored in the semiconductor memory chips; and the semiconductor memory device further comprises an error correction decoding unit configured to correct the errors in the information by performing a decoding process of the second correction code.

7. The semiconductor memory device according to claim 1, further comprising an error correction decoding unit configured to correct the error in the information by performing a decoding process of the first correction code, wherein the parameter processing unit changes the parameters of the semiconductor memory chips storing the information whose error has been corrected by the error correction decoding unit, and writes the parameters changed into the parameter storage units, respectively.

8. The semiconductor memory device according to claim 1, further comprising a monitoring unit configured to generate management data that indicates a state of information writing and reading with respect to the semiconductor memory chips, wherein when the management data satisfies a predetermined condition, the parameter processing unit changes the parameters respectively corresponding to the number of semiconductor memory chips no greater than the predetermined number of semiconductor memory chips, and writes the parameters changed into the parameter storage units, respectively.

9. The semiconductor memory device according to claim 1, wherein the parameter is at least one of a current, a voltage a voltage pulse width, and a pulse number of voltage used for the information writing or reading.

10. A controlling method for a semiconductor memory device that includes a plurality of semiconductor memory chips configured to store therein information depending on an amount of accumulated charge, a plurality of parameter storage units that are provided in correspondence with the semiconductor memory chips, each of the plurality of parameter storage units being configured to store therein a parameter that defines an electrical characteristic of a signal used for writing information into or reading information from a corresponding one of the semiconductor memory chips, an error correction encoding unit, and a parameter processing unit, the controlling method comprising:

generating, by the error correction encoding unit, a first correction code capable of correcting an error in the information stored in a number of semiconductor memory chips no greater than a predetermined number out of the semiconductor memory chips, from the information stored in the semiconductor memory chips; and changing, by the parameter processing unit, the parameters respectively corresponding to the number of semiconductor memory chips no greater than the predetermined number, and writing the parameters changed into the parameter storage units, respectively.

* * * * *